(12) United States Patent
Lim

(10) Patent No.: US 8,339,852 B2
(45) Date of Patent: *Dec. 25, 2012

(54) NON-VOLATILE MEMORY DEVICE

(75) Inventor: Kyu Hee Lim, Incheon (KR)

(73) Assignee: Hynix Semiconductor Inc., Icheon-si (KR)

( * ) Notice: Subject to any disclaimer, the term of this patent is extended or adjusted under 35 U.S.C. 154(b) by 132 days.

This patent is subject to a terminal disclaimer.

(21) Appl. No.: 12/781,779

(22) Filed: May 17, 2010

(65) Prior Publication Data

US 2010/0220529 A1 Sep. 2, 2010

Related U.S. Application Data

(63) Continuation of application No. 11/965,969, filed on Dec. 28, 2007, now Pat. No. 7,719,891.

(30) Foreign Application Priority Data

Jun. 28, 2007 (KR) .................. 10-2007-0064333

(51) Int. Cl.
*G11C 16/06* (2006.01)
*G11C 16/08* (2006.01)
*G11C 7/02* (2006.01)
*G11C 8/08* (2006.01)

(52) U.S. Cl. ......... 365/185.09; 365/185.23; 365/185.17; 365/185.18; 365/185.22; 365/202; 365/210.11; 365/230.06

(58) Field of Classification Search .............. 365/185.02, 365/185.09, 185.17, 185.18, 185.2, 185.22, 365/185.23, 210.11, 230.06, 202

See application file for complete search history.

(56) References Cited

U.S. PATENT DOCUMENTS

| 6,055,190 | A | * | 4/2000 | Lu et al. ............... 365/185.22 |
| 6,118,702 | A | | 9/2000 | Shieh et al. |
| 6,125,052 | A | | 9/2000 | Tanaka |
| 6,735,125 | B2 | | 5/2004 | Hirano |
| 7,170,784 | B2 | | 1/2007 | Cernea et al. |
| 7,173,854 | B2 | | 2/2007 | Cernea et al. |
| 7,486,562 | B2 | | 2/2009 | Ogawa et al. |
| 7,492,640 | B2 | | 2/2009 | Mokhlesi |
| 7,606,071 | B2 | | 10/2009 | Sekar et al. |
| 7,719,891 | B2 | * | 5/2010 | Lim ..................... 365/185.09 |

FOREIGN PATENT DOCUMENTS

KR 1020060056687 A 5/2006

* cited by examiner

*Primary Examiner* — J. H. Hur
(74) *Attorney, Agent, or Firm* — Kilpatrick Townsend & Stockton LLP

(57) ABSTRACT

A non-volatile memory device includes a sensing circuit that is configured to detect a charge of a common source line and a voltage controller that is configured to vary a level of a voltage being inputted to a word line in response to a result of the detection of the sensing circuit.

10 Claims, 3 Drawing Sheets

1

NON-VOLATILE MEMORY DEVICE

CROSS-REFERENCE TO RELATED APPLICATIONS

This application is a continuation of U.S. patent application Ser. No. 11/965,969, filed on Dec. 28, 2007, which claims priority from Korean Patent Application No. 2007-64333, filed on Jun. 28, 2007, the contents of which are incorporated herein by reference in their entirety.

BACKGROUND OF THE INVENTION

The present invention relates to a non-volatile memory device and more particularly to a method for adjusting a level of a verifying voltage supplied to a word line to reduce a source line bouncing phenomenon.

Recently, the demand has increased for a non-volatile memory device which electrically programs and erases data, and does not require a refresh function for periodically rewriting data.

The non-volatile memory device generally includes a memory cell array having matrix-typed cells for storing data, and a page buffer for programming data to a specific memory cell or reading data from a certain cell.

The page buffer has a pair of bit lines connected to a given memory cell, a register for temporarily storing data to be programmed to the memory cell or data read from a certain cell, a sensing node for sensing a voltage level of a specific bit line or voltage level of a certain register, and a bit line selecting circuit for controlling connection of the bit line and the sensing node.

In a program operation of the non-volatile memory device, if source line bouncing occurs, it may be verified that a specific cell is programmed even though the cell is not adequately programmed. As a result, when reading the cell after the program operation is finished, the cell may be read as not programmed.

SUMMARY OF THE INVENTION

It is a feature of the present invention to provide a non-volatile memory device for discriminating whether or not a source line bouncing phenomenon has occurred, and adjusting a verifying voltage in accordance with the discriminating result.

A non-volatile memory device according to one example embodiment of the present invention includes a bouncing sensing circuit configured to compare a source line current passing to a common source line with a reference current, and output a bouncing sensing signal in accordance with the comparing result; and a word line voltage controller configured to provide a verifying voltage increased by a certain level to a word line in accordance with level of the bouncing sensing signal.

As described above, in case that a source line bouncing phenomenon is occurred in a program operation, a verifying voltage applied to a selected word line is adjusted so that an under programmed cell is not generated.

DESCRIPTION OF SPECIFIC EMBODIMENTS

Hereinafter, the embodiments of the present invention will be explained in more detail with reference to the accompanying drawings.

Figure 1:
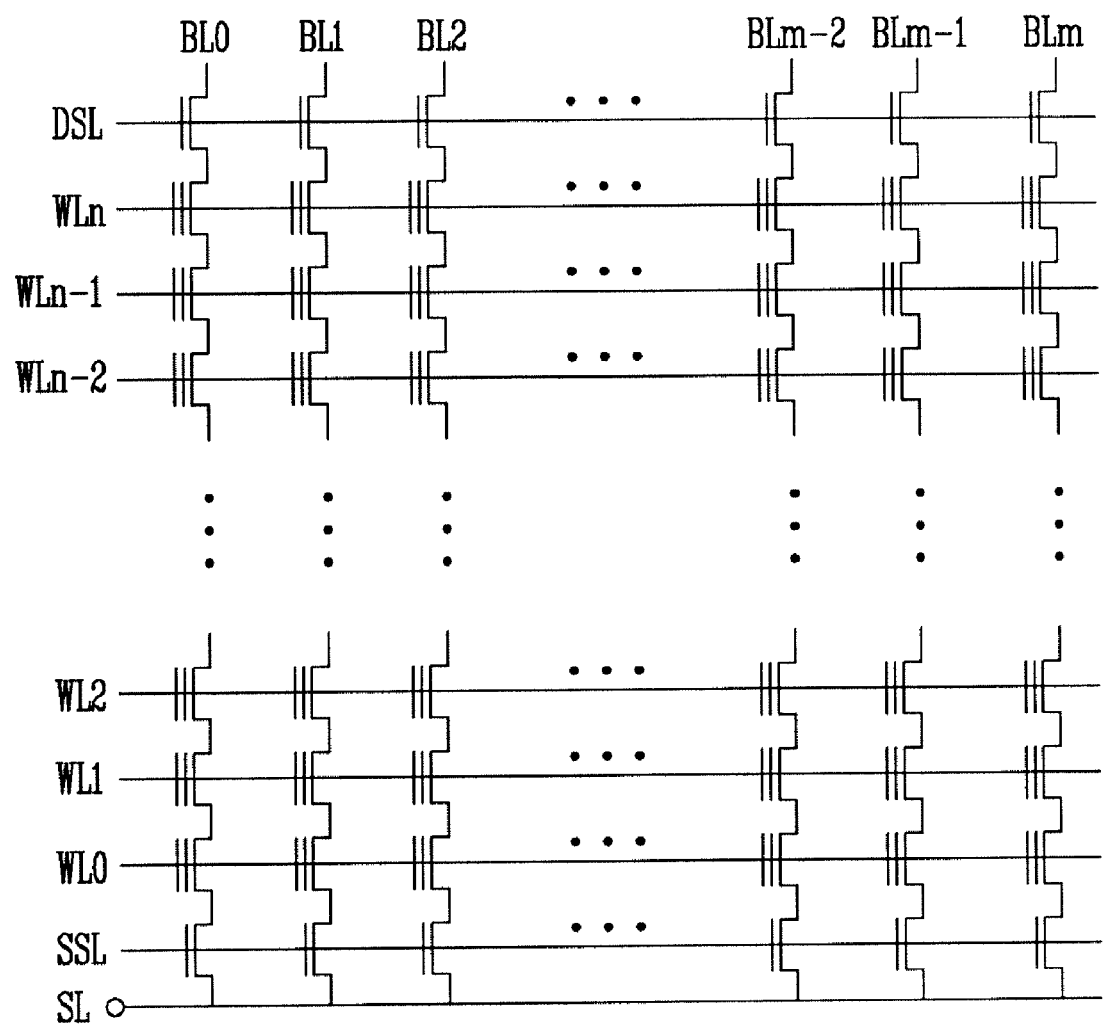
FIG. 1 is a view illustrating a circuitry of a memory cell array according to one example embodiment of the present invention.

FIG. 1 is a view illustrating a circuitry of a memory cell array according to one example embodiment of the present invention.

The memory cell array includes memory cells for storing data, word lines WL0 to WLn for activating selectively the memory cells, and bit lines BL0 to BLm for inputting/outputting data in the memory cell. Here, the word lines WL0 to WLn and the bit line BL0 to BLm are disposed with matrix shape. In addition, the memory cell array has the memory cells disposed in series between a source select line SSL and a drain select line DSL. This is referred to as a cell string.

The word lines are coupled to gates of the memory cells. Here, a group including memory cells coupled commonly to one word line is referred to as a page.

One block is formed by coupling a plurality of cell strings coupled to each of bit lines BL0 to BLm in parallel to a common source line.

A program operation about the memory cell array is performed in a unit of a page. Then, a verifying operation is performed for verifying whether or not the program operation has completed.

A program of a corresponding cell is verified in accordance with a voltage level of a bit line precharged to a specific voltage, applying a verifying reference voltage Vread to a word line coupled to a page to be verified and applying a pass voltage Vpass to the other word lines, the source select line SSL and the drain select line DSL.

In the case that the voltage level of the bit line is lowered due to current passing to the common source line SL, it is determined that a corresponding cell is not completely programmed. However, if the voltage level of the bit line is maintained with a precharged state without current passing to the common source line SL, it is determined that a corresponding cell is completely programmed.

On the other hand, in the case that many '1' cells, i.e. cells not to be programmed exist in one page, a large amount of current passes to the common source line SL. As a result, a source line bouncing phenomenon can occur.

In the case that line bouncing phenomenon has occurred, the amount of current passing to the cell string is reduced. As a result, the voltage level of the bit line is not adequately pulled-down, and so the page buffer may determine that a cell not programmed is completely programmed.

That is, the page buffer determines that the cell is programmed despite a threshold voltage of the cell is not adequately increased to a desired voltage, and so the verifying operation is prematurely finished. Accordingly, when a read operation on the cell is performed, a problem exists in that the cell is regarded as an erased cell.

To solve the problem, the non-volatile memory device of the present invention further includes a word line voltage controller for sensing a time point at which the source line bouncing phenomenon has occurred, and increasing a voltage applied to a word line of a page to be verified by a certain level in accordance with the sensing result.

Figure 2:
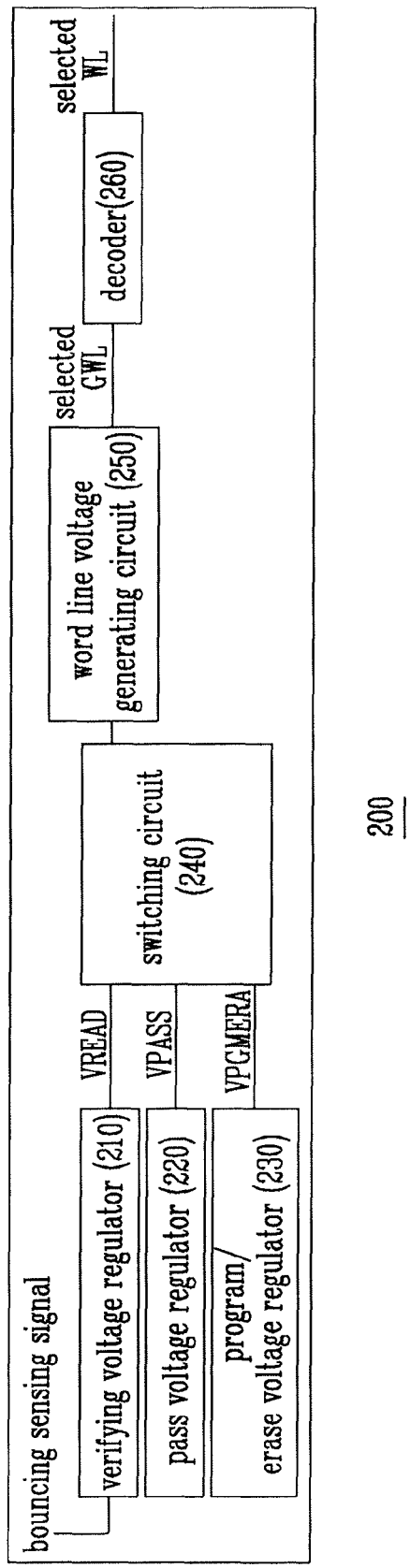
FIG. 2 is a block diagram illustrating a word line voltage controller according to one example embodiment of the present invention.

FIG. 2 is a block diagram illustrating the word line voltage controller according to one example embodiment of the present invention.

The word line voltage controller 200 applies a program/erase voltage, a verifying voltage or a pass voltage, etc to a specific word line in accordance with operation of the non-volatile memory device, and includes a verifying voltage regulator 210, a pass voltage regulator 220, and a program/erase voltage regulator 230.

In addition, the word line controller 200 provides a verifying voltage increased by a certain level to a selected word line in accordance with level of a bouncing sensing signal described below.

The word line controller 200 further includes a switching circuit 240 for applying output voltage of each of the regulators 210, 220 and 230 to the selected word line, and a word line voltage generating circuit 250 for generating a bias voltage on the basis of the output voltage. The bias voltage having high voltage is applied to a selected global word line GWL or a specific word line WL.

The non-volatile memory device of the present embodiment senses the source line bouncing phenomenon and provides information related to the source line bouncing phenomenon to the verifying voltage regulator 210 in accordance with the sensing result, thereby changing a level of a verifying voltage Vread outputted from the verifying voltage regulator 210. Accordingly, the non-volatile memory device should have a bouncing sensing circuit for sensing the source line bouncing phenomenon.

Figure 3:
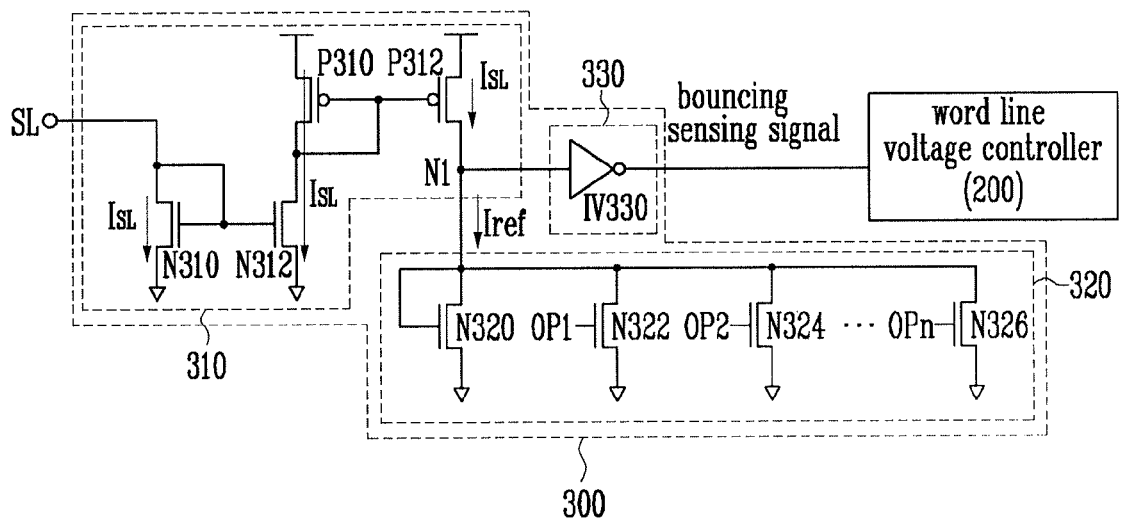
FIG. 3 is a view illustrating a bouncing sensing circuit according to one example embodiment of the present invention.

FIG. 3 is a view illustrating the bouncing sensing circuit according to one example embodiment of the present invention.

The bouncing sensing circuit 300 compares current passing to the common source line SL with a reference current, and outputs the bouncing sensing signal in accordance with the comparing result.

This bouncing sensing circuit 300 includes a current comparing circuit 310 for comparing a source line current Isl with the reference current Iref, a reference current outputting circuit 320 for generating the reference current Iref, and a bouncing sensing signal outputting circuit 330 for outputting the bouncing sensing signal in accordance with the comparing result.

The current comparing circuit 310 compares the source line current Isl outputted from the common source line SL shown in FIG. 1 with the reference current Iref.

This current comparing circuit 310 includes a first N-MOS transistor N310 coupled as a diode between the common source line SL and a ground, and a second N-MOS transistor N312 coupled in a mirror type between a gate of the first N-MOS transistor N310 and the ground. In addition, the current comparing circuit 310 further has a first P-MOS transistor P310 coupled as a diode between a power supply voltage terminal and the second N-MOS transistor N312, and a second P-MOS transistor P312 coupled in a mirror type between a gate of the first P-MOS transistor P310 and the power supply voltage terminal. Here, one terminal of the second P-MOS transistor P312 is coupled to a comparing signal output node N1.

Accordingly, a first source line current path is formed through the first N-MOS transistor N310, and a second source line current path is formed through the first P-MOS transistor P310 and the second N-MOS transistor N312. Additionally, a third source line current path is formed through the second P-MOS transistor P312.

It is desirable that current passing through the first to third source line current paths are the same magnitude. In this case, the current passing through the third source line current path is regarded as a current having the same magnitude as the current passing through the common source line SL, and is compared with the reference current Iref. This comparing operation will be described below.

The reference current outputting circuit 320 includes an N-MOS transistor N320 coupled as a diode between the comparing signal outputting node N1 and the ground, and N-MOS transistors N322, N324 and N326 coupled in parallel between the comparing signal outputting node N1 and the ground and turned on in response to option signals OP1 to OPn. Here, the reference current Iref may be adjusted by controlling the turn-on of each of the N-MOS transistors N322, N324 and N326.

The bouncing sensing signal outputting circuit 330 has an inverter IV330 for inverting a voltage level of the outputting node N1 and outputting the inverted voltage.

In the case that the source line bouncing phenomenon has not occurred, a voltage of the common source line SL maintains a 0V. In this case, the source line current Isl is not passed through the P-MOS transistor P312, and no current is passed to the comparing signal outputting node N1. As a result, the bouncing sensing signal has a high level.

In the case that the voltage of the common source line SL is increased accordingly as the source line bouncing phenomenon occurs, the source line current Isl is passed through the P-MOS transistor P312. Here, if the source line current Isl is smaller than the predetermined reference current Iref, the comparing signal outputting node N1 maintains a low level, and the bouncing sensing signal has a high level.

However, in the case that the source line current Isl is higher than the reference current Iref, the current of the comparing signal outputting node N1 is not adequately passed, and so the comparing signal outputting node N1 has a certain voltage. In this case, the inverter IV 330 senses the voltage of the comparing signal outputting node N1, thereby outputting the bouncing sensing signal having a low level.

In brief, the bouncing sensing circuit 300 determines through magnitude of the source line current Isl whether or not the source bouncing phenomenon has occurred, and then transmits the bouncing sensing signal having a low level to the word line voltage controller 200 when the source line bouncing phenomenon has occurred.

Hereinafter, the verifying voltage Vread changed in accordance with the bouncing sensing signal will be described in detail.

Figure 4:
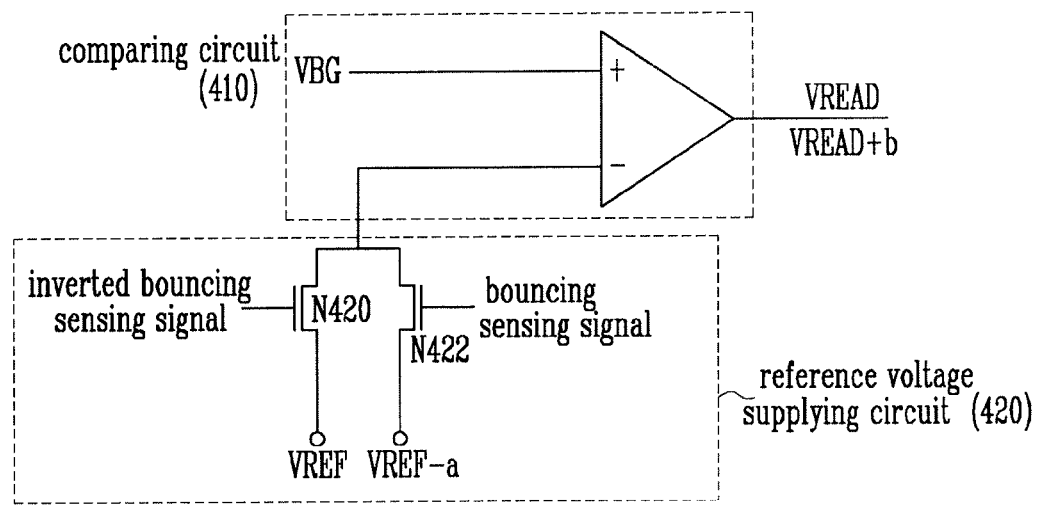
FIG. 4 is a view illustrating a verifying voltage regulator according to one example embodiment of the present invention.

FIG. 4 is a view illustrating the verifying voltage regulator according to one example embodiment of the present invention.

The word line voltage controller 200 includes a verifying voltage regulator 210 for outputting the verifying voltage increased by a certain level in accordance with a level of the bouncing sensing signal. Here, the increased voltage may be about 100 mV to 200 mV.

The verifying voltage regulator 210 includes a comparing circuit 410 for comparing a band gap voltage VBG with the reference voltage and outputting the verifying voltage Vread in accordance with the comparing result, and a reference voltage supplying circuit 420 for providing the reference voltage Vref varied depending on a level of the bouncing sensing signal.

The comparing circuit 410 receives the band gap voltage VBG through its non-inverting terminal (+), receives the reference voltage through its inverting terminal (−), and outputs the verifying voltage Vread in accordance with the received voltages.

The reference voltage supplying circuit 420 has a first N-MOS transistor N410 for providing a first reference voltage Vref to the inverting terminal (−) of the comparing circuit 410 in response to the bouncing sensing signal having high a level, and a second N-MOS transistor N412 for providing a second reference voltage Vref-a smaller than the first reference voltage Vref to the inverting terminal (−) of the comparing circuit 410 in response to an inverted bouncing sensing signal having a high level.

The verifying voltage regulator 210 may further include an inverter (not shown) for inverting the bouncing sensing signal and outputting the inverted bouncing sensing signal.

Accordingly, in the case that the inverted bouncing sensing signal is outputted with a high level in accordance with occurrence of the source line bouncing phenomenon, only the second N-MOS transistor N422 is turned on. As a result, the second reference voltage Vref-a is provided to the comparing circuit 410.

However, in the case that the source line bouncing phenomenon has not occurred, only the first N-MOS transistor N420 is turned on. As a result, the first reference voltage Vref is provided to the comparing circuit 410. Here, the second reference voltage Vref-a is smaller than the first reference voltage Vref by 100 mV to 200 mV.

The comparing circuit 410 outputs a first verifying voltage Vread when the first reference voltage Vref is inputted because the source line bouncing phenomenon has not occurred, and outputs a second verifying voltage Vread+b higher than the first verifying voltage Vread when the second verifying voltage Vref-a smaller than the first reference voltage Vref is inputted in accordance with an occurrence of the source line bouncing phenomenon. Here, since the second verifying voltage Vread+b, higher than the first verifying voltage Vread, is provided when the source line bouncing phenomenon has occurred, current reduced by the source line bouncing phenomenon is compensated. As a result, an under program may be prevented.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A non-volatile memory device comprising:
   a sensing circuit configured to detect amounts of charges of a common source line, the sensing circuit including a pull-up driver configured to charge a first node in response to the charges of the common source line and a pull-down driver configured to discharge the first node; and
   a voltage controller configured to selectively vary a level of a voltage being inputted to a word line according to a result of the detection of the sensing circuit.

2. The non-volatile memory device of claim 1, wherein the sensing circuit detects the amounts of the charges of the common source line during a verifying operation.

3. The non-volatile memory device of claim 1, wherein the pull-down driver discharges the first node constantly.

4. The non-volatile memory device of claim 3, wherein the sensing circuit further includes a buffer for buffering a signal of the first node.

5. The non-volatile memory device of claim 1, wherein the voltage controller selectively increases the level of the voltage according to the result of the detection.

6. The non-volatile memory device of claim 1, wherein the voltage controller varies the level of the voltage in proportion to the amounts of the charges of the common source line.

7. The non-volatile memory device of claim 1, comprising a plurality of memory cells connected in series between the common source line and a bit line, the word line being connected to a gate of one of the memory cells.

8. A non-volatile memory device comprising:
   a sensing circuit configured to detect amounts of charges of a common source line; and
   a voltage controller configured to selectively vary a level of a voltage being inputted to a word line according to a result of the detection of the sensing circuit, the voltage controller including a reference voltage supplying circuit configured to output a reference voltage that varies depending on the result of the detection and a comparing circuit configured to compare a first voltage with the reference voltage.

9. The non-volatile memory device of claim 8, wherein the reference voltage supplying circuit varies the reference voltage in proportion to the amounts of the charges of the common source line.

10. The non-volatile memory device of claim 8, wherein the reference voltage supplying circuit includes:
    a first switching unit configured to provide a first reference voltage to the comparing circuit in response to the result of the detection; and
    a second switching unit configured to provide a second reference voltage smaller than the first reference voltage to the comparing circuit in response to the result of the detection,
    wherein the first switching unit and the second switching unit operate selectively according to the result of the detection.

* * * * *